(12) United States Patent
Han et al.

(10) Patent No.: US 7,008,856 B2
(45) Date of Patent: Mar. 7, 2006

(54) METHOD FOR FABRICATING AND-TYPE FLASH MEMORY CELL

(75) Inventors: Chang Hun Han, Gyeonggi-do (KR); Bong Kil Kim, Gyeonggi-do (KR)

(73) Assignee: DongbuAnam Semiconductor, Seoul (KR)

( * ) Notice: Subject to any disclaimer, the term of this patent is extended or adjusted under 35 U.S.C. 154(b) by 23 days.

(21) Appl. No.: 10/750,250

(22) Filed: Dec. 31, 2003

(65) Prior Publication Data

US 2004/0157403 A1 Aug. 12, 2004

(30) Foreign Application Priority Data

Dec. 31, 2002 (KR) .................. 10-2002-0088282

(51) Int. Cl.
*H01L 21/76* (2006.01)
(52) U.S. Cl. .................. 438/424; 438/950
(58) Field of Classification Search ............. 438/424, 438/950
See application file for complete search history.

(56) References Cited

U.S. PATENT DOCUMENTS 5,411,913 A   5/1995  Bashir et al.
6,165,871 A * 12/2000  Lim et al. .............. 438/437
6,277,697 B1 * 8/2001  Lee ........................ 438/296
6,355,540 B1 * 3/2002  Wu ......................... 438/433

FOREIGN PATENT DOCUMENTS

KR    10-2001-0088298    12/2001

\* cited by examiner

*Primary Examiner*—Caridad Everhart
(74) *Attorney, Agent, or Firm*—Hanley, Flight & Zimmerman LLC

(57) ABSTRACT

A flash memory cell and fabrication method thereof are disclosed. An example fabrication method deposits a pad oxide layer and a pad nitride layer on a semiconductor substrate, patterns the pad nitride layer, implants ions into the substrate to form an ion implant region, forms spacers on sidewalls of the pad nitride layer pattern, removes some part of the pad oxide layer and the top portion of the substrate through an etching process using the spacers as a mask to form a trench that divides the ion implant region into two parts. The example fabrication method also forms a gap filling insulating layer over the resulting substrate, and forms a trench isolation layer and junction regions simultaneously by removing the spacers, the pad nitride layer pattern, the pad oxide layer, and the top portion of the gap filling insulating layer.

6 Claims, 8 Drawing Sheets

METHOD FOR FABRICATING AND-TYPE FLASH MEMORY CELL

FIELD OF THE DISCLOSURE

The present disclosure relates generally to semiconductor devices and, more particularly, to a method for manufacturing an AND type flash memory device.

BACKGROUND

In fabricating a flash memory device, the cell array is an important factor determining a type of a flash memory device together with a memory device structure, an erasing method, and a programming method. Among various cell array structures, AND-type cell arrays can embody the density and the high-performance operation of a flash memory.

FIG. 1 is a schematic diagram illustrating a cell array of a conventional AND-type flash memory device. The conventional AND-type flash memory device embodies densification (i.e., greater density) by sharing bit line contacts and source lines in a plurality of cells and suppresses the occurrence of disturbances during program operation through parallel connection and the layered bit lines and source lines. However, a conventional AND-type flash memory device has a shortcoming in that interconnection density in a diffusion layer is high.

FIGS. 2a through 2h illustrate, in cross-sectional views, the fabricating process of an AND-type flash memory device according to a conventional method. Referring to FIG. 2a, a pad oxide layer 13 and a pad nitride layer 15 are deposited in sequence on a silicon substrate 11. Then, a photoresist pattern 15 is formed on the pad nitride layer 15.

Referring to FIG. 2b, some part of the pad nitride layer 15, the pad oxide layer 13, and the substrate 11 is removed by an etching process using the photoresist pattern 17 as a mask. As a result, a pad oxide pattern 13a and a pad nitride pattern 15a are formed on the substrate 11 and a trench 19 with a predetermined depth is formed in the substrate 11.

Referring to FIG. 2c, the photoresist pattern 17 is removed. Then, a gap filling oxide layer 21 is deposited on the pad nitride pattern 15a and in the trench 19 to fill completely the trench 19.

Referring to FIG. 2d, an etching process is performed until the pad nitride pattern 15a is exposed to planarize the gap filling oxide layer 21.

Referring to FIG. 2e, the pad nitride pattern 15a, the pad oxide pattern 13a, and the top portion of the gap filling oxide layer 21a are removed to form a trench isolation layer 21b. Then, a nitride layer 23 for a hard mask is formed on the resulting substrate.

Referring to FIG. 2f, a mask pattern 25 to form junction regions is formed on the nitride layer 23.

Referring to FIG. 2g, an ion implantation process is performed using the mask pattern 25 as a mask to form N+ junction regions 27a and 27b in the substrate 11. The ion implanted is preferably As or phosphorus (P).

Referring to FIG. 2h, the mask pattern 25 and the nitride layer 23 are removed. Then, a floating gate (not shown) is formed on the substrate and an oxide-nitride-oxide (ONO) layer is deposited.

Consequently, as shown FIG. 5, an AND-type flash memory cell comprising a floating gate oxide 50, a floating gate 55, a control gate oxide 60, and a control gate 65 is completed.

However, in fabricating an AND-type flash memory cell, the conventional method has to apply twice an exposure process using deep ultraviolet (hereinafter referred to as "DUV") to form a mask for a trench and a mask for N+ junction regions. In addition, a mask overlap margin is necessarily required due to the two mask processes, thereby causing an increase in cell size. In detail, in order to ensure an appropriate width (XB in FIG. 4) of junction regions, a margin has to be considered to address the misalignment of the mask toward the trench isolation layer and, therefore, cell size increases due to such a margin.

Moreover, with the high-integration of a semiconductor device, a junction region in a substrate has to have a width less than 0.25 μm. Such a length can be formed only through a process using DUV wavelength or a higher wavelength than that. However, a mask process using DUV may increase manufacturing costs due to a high photoresist price and reticle making costs.

DETAILED DESCRIPTION

As described in detail below, an example method for fabricating an AND-type flash memory provides a high-integration of interconnection density in a diffusion layer by forming self-aligned junctions in a substrate. More specifically, an example method for fabricating an AND-type flash memory cell depositis a pad oxide layer and a pad nitride layer on a silicon substrate, removes some part of the pad nitride layer to form a pad nitride layer pattern, implants ions into the substrate to form ion implant regions, forms spacers on the sidewalls of the pad nitride layer pattern, removes some part of the pad oxide layer and the top portion of the substrate through an etching process using the spacers as a mask to form a trench, which divides the ion implant region into two parts. In addition, the example method forms a gap filling insulating layer over the resulting substrate, and forms a trench isolation layer and junction regions simultaneously by removing the spacers, the pad nitride layer pattern, the pad oxide layer, and the top portion of the gap filling insulating layer.

Figure 1:
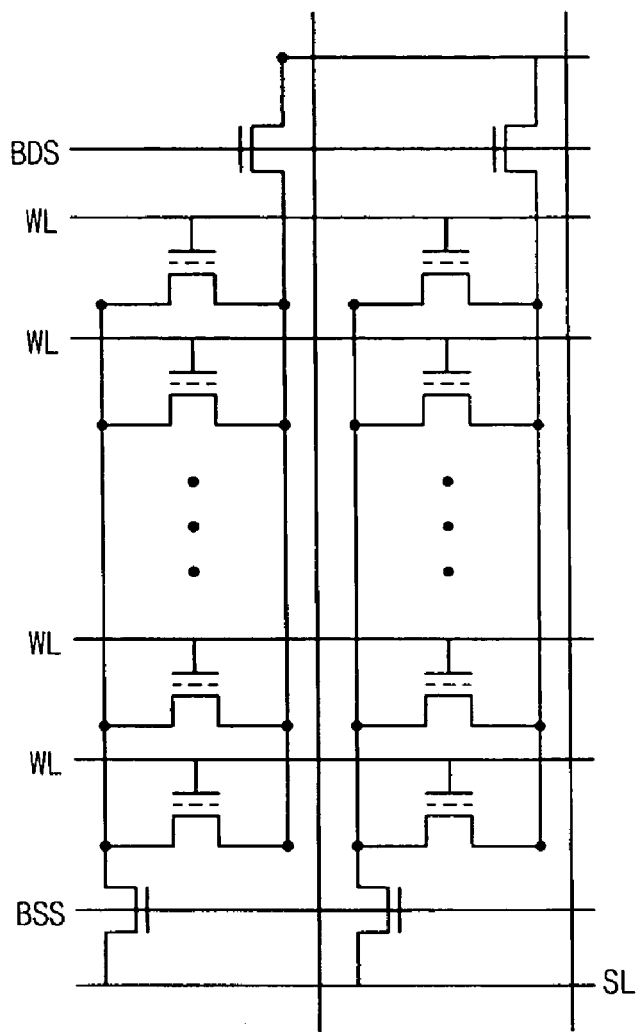
FIG. 1 is a schematic diagram illustrating the cell array of a conventional AND-type flash memory device.
Figure 2A:
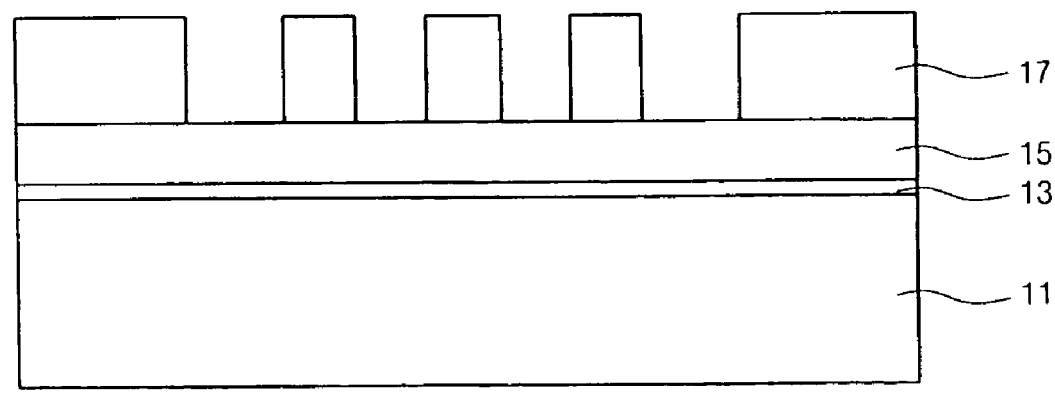
FIGS. 2a through 2h illustrate, in cross-sectional views, the fabricating process of an AND-type flash memory device according to a conventional method.
Figure 2B:
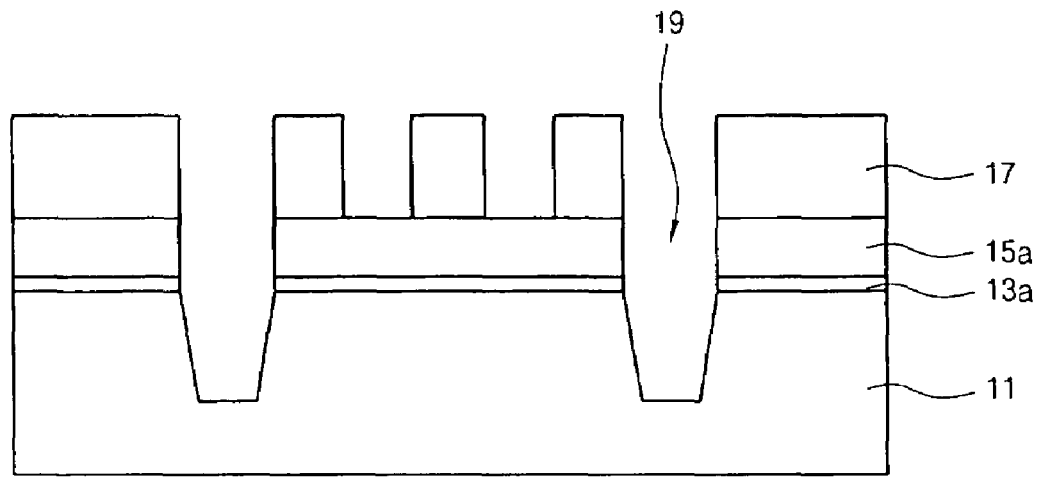
Figure 2C:
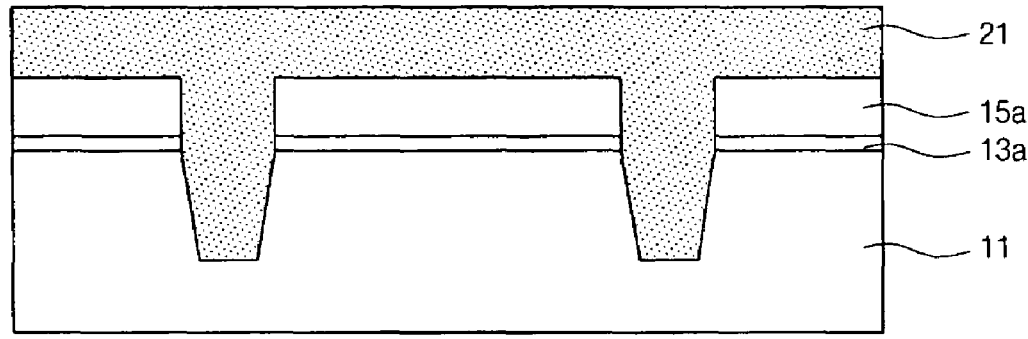
Figure 2D:
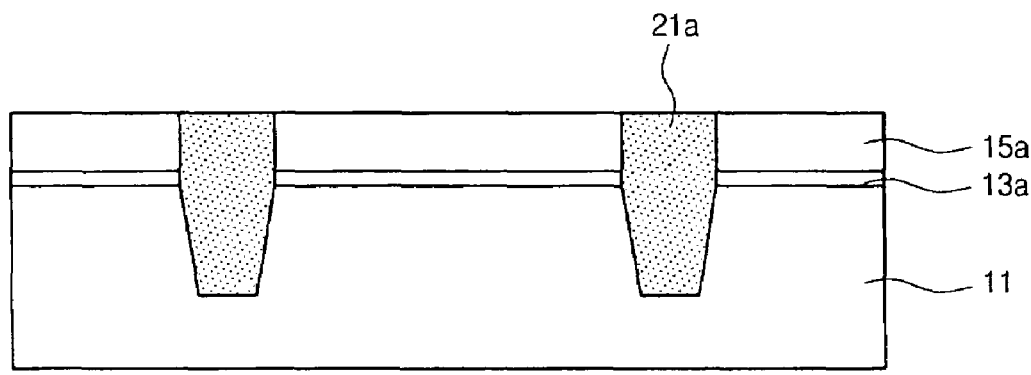
Figure 2E:
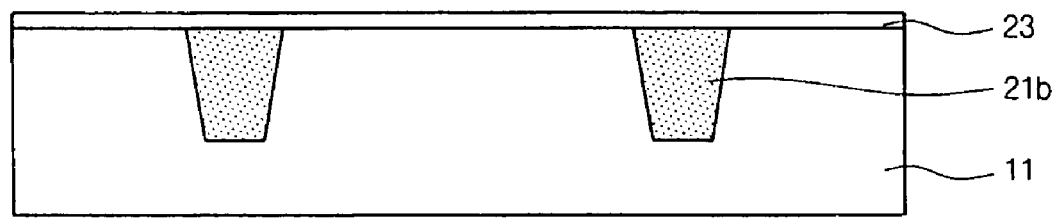
Figure 2F:
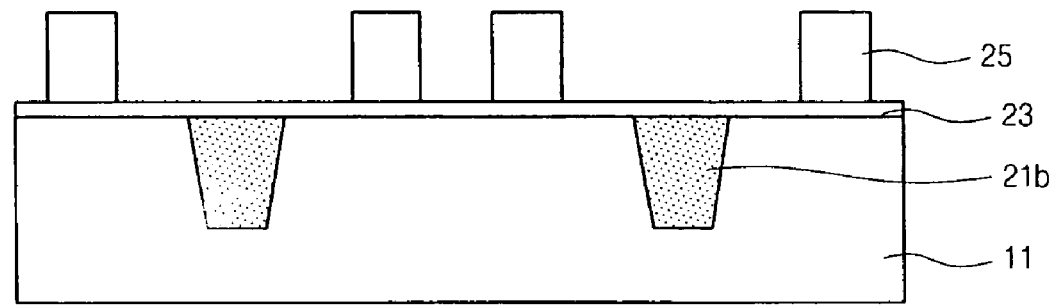
Figure 2G:
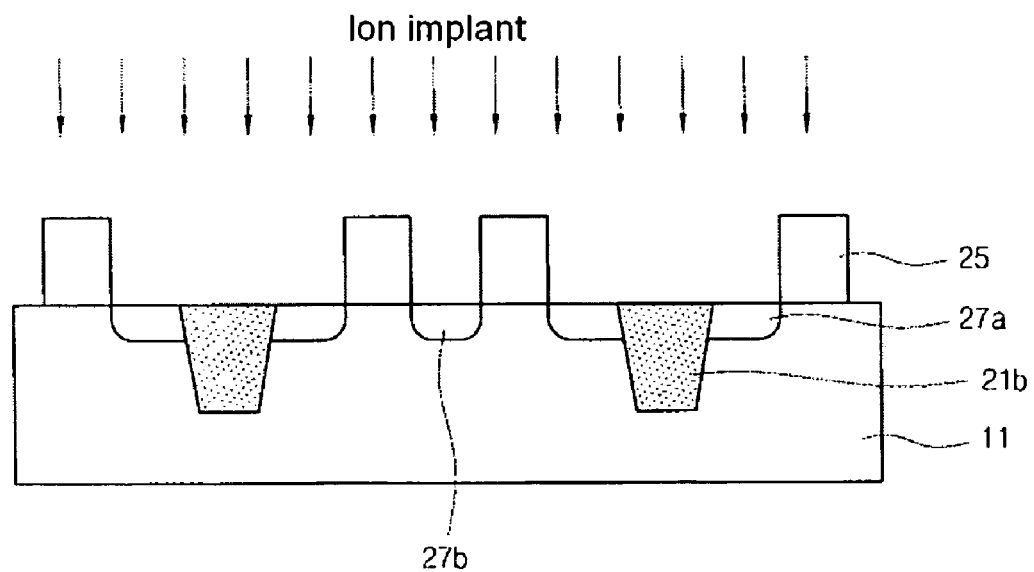
Figure 2H:
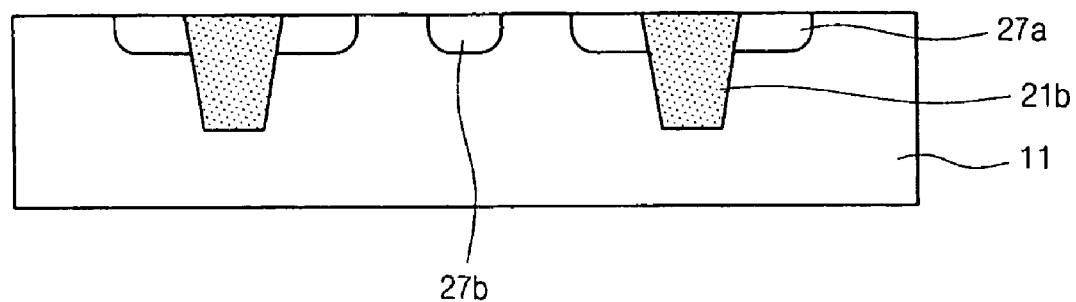
Figure 3:
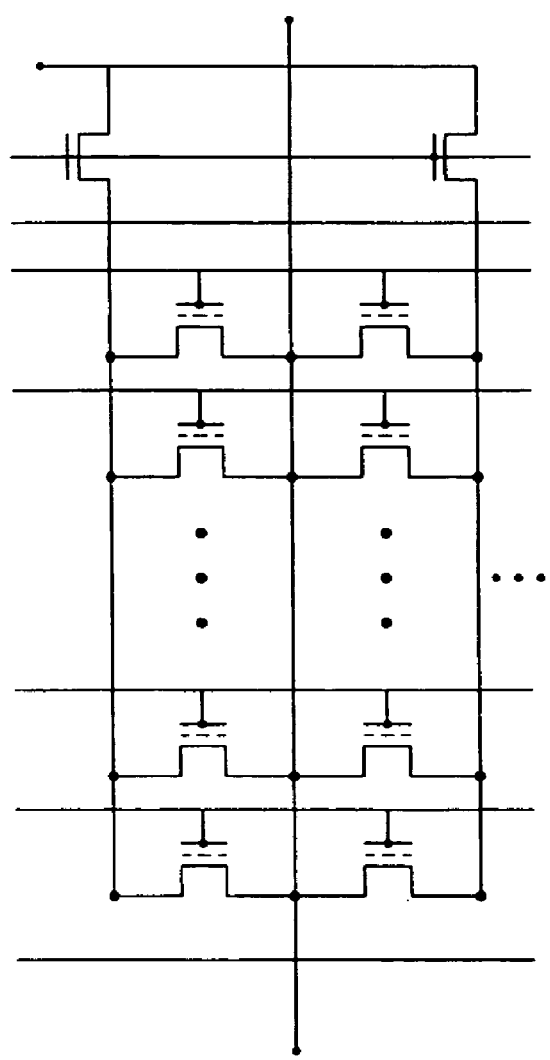
FIG. 3 is a schematic diagram illustrating the cell array of an example AND-type flash memory device.
Figure 4:
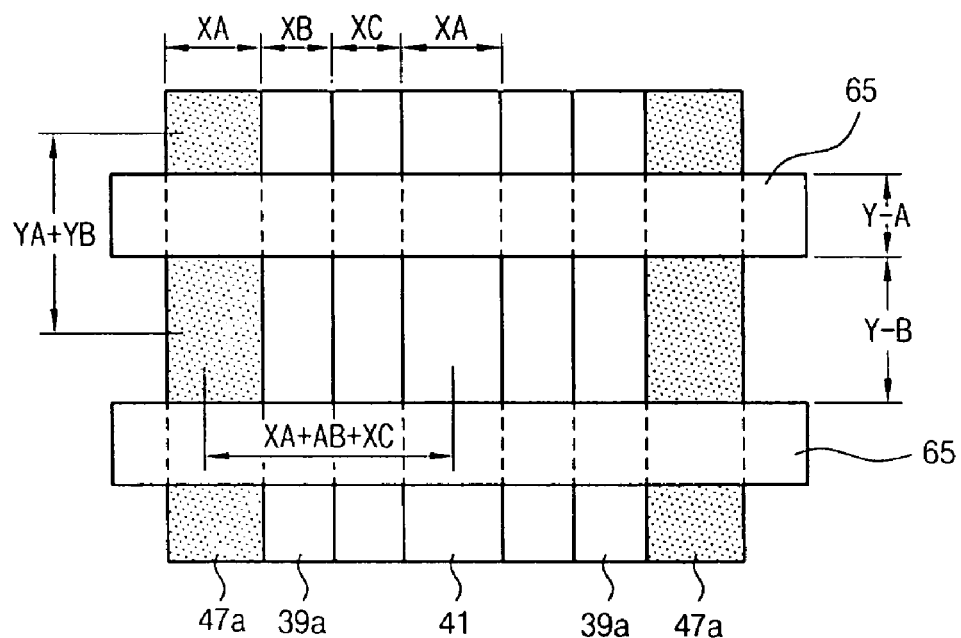
FIG. 4 is a layout of an example AND-type flash memory cell.
Figure 5:
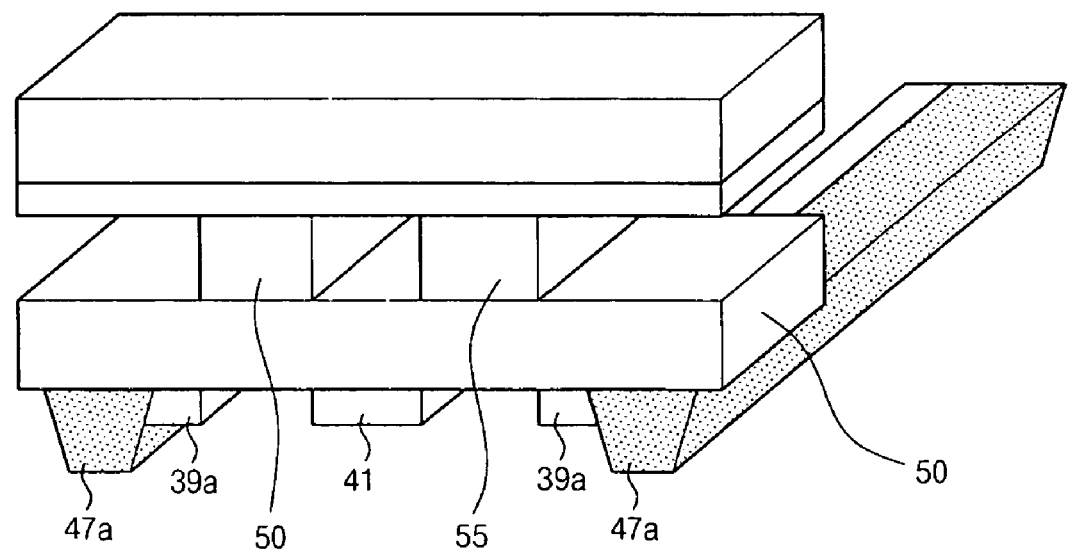
FIG. 5 is a perspective view of an example AND-type flash memory cell.

Referring to FIG. 3, in an example AND-type flash memory cell, one of junction regions positioned between device isolation layers is shared between two cells in order to embody densification of a diffusion layer. FIGS. 4 and 5 illustrate, in a layout and a perspective view, such an array structure of the AND-type flash memory device.

Figure 6A:
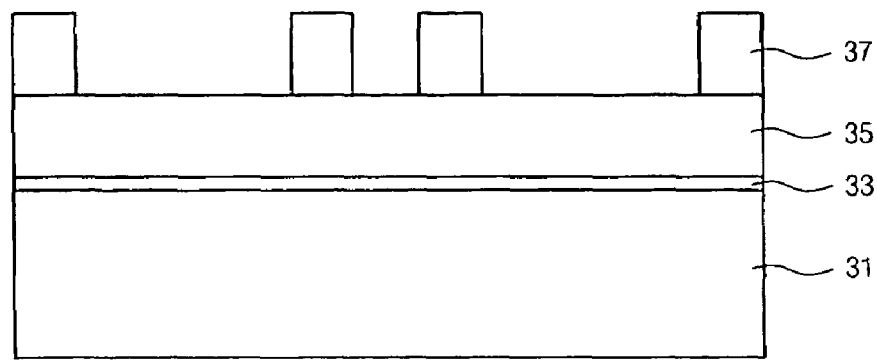
FIGS. 6a through 6i illustrate, in cross-sectional views, the fabricating process of an example AND-type flash memory cell.

Referring to FIG. 6a, a pad oxide layer 33 and a pad nitride layer 35 are deposited in sequence on a substrate 31. Then, a photoresist pattern 37 is formed on the pad nitride layer 35.

Figure 6B:
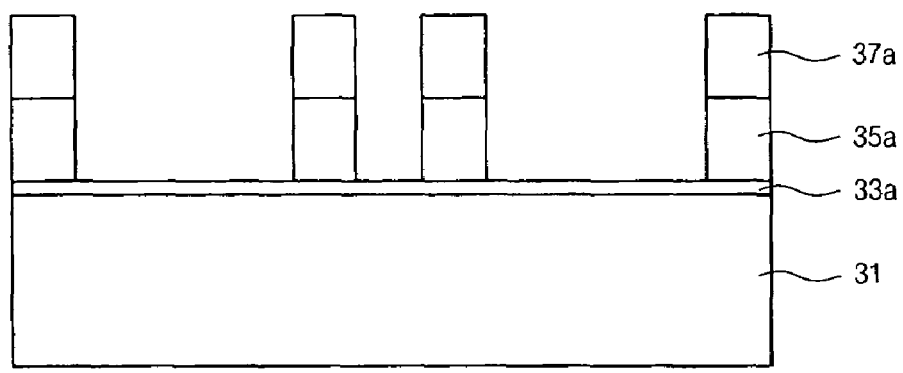

Referring to FIG. 6b, some part of the pad nitride layer 35 is removed through an etching process using the photoresist pattern 37 as a mask. As a result, some part of the pad oxide layer 33 is exposed. Then, the photoresist pattern 37 is removed.

Figure 6C:
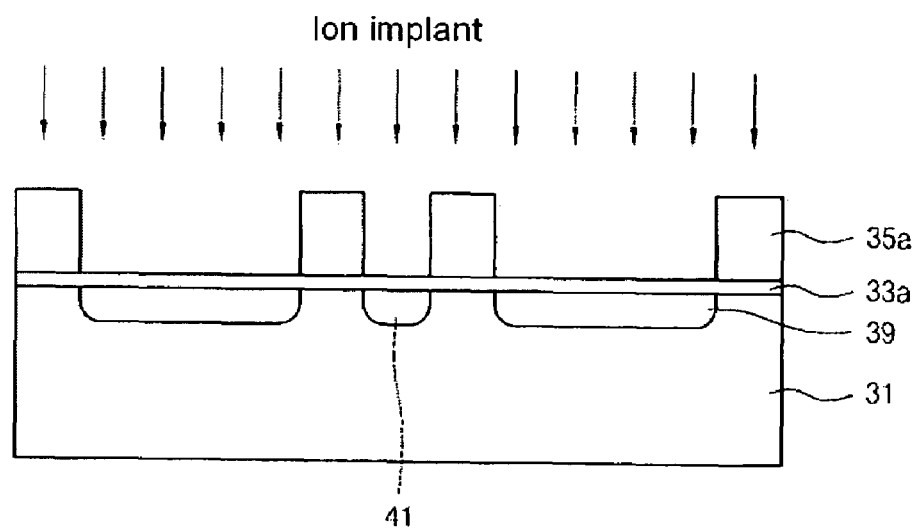

Referring to FIG. 6c, ions are implanted into the substrate 31 to form ion implant regions 39 and 41. The implanted ions are preferably As ion or P. Here, the pad oxide layer 33 functions as a screen oxide layer to prevent damage of the silicon substrate during the ion implantation.

Figure 6D:
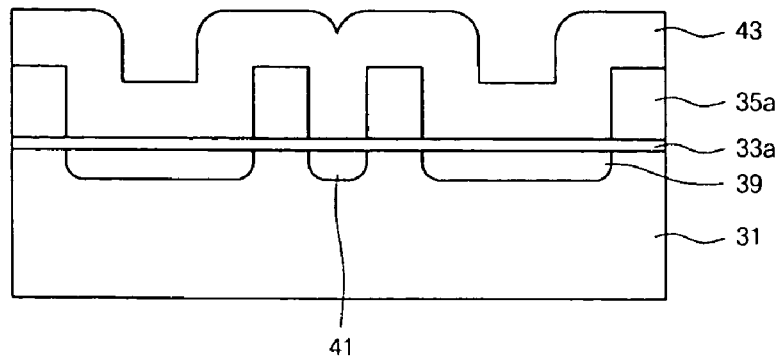

Referring to FIG. 6d, an insulating layer 43 is deposited over the resulting substrate 31. The insulating layer 43 is preferably between 500 Å and 1500 Å in thickness and is preferably formed of a material selected from the group consisting of nitride and TEOS (tetraethyl orthosilicate) oxides.

Figure 6E:
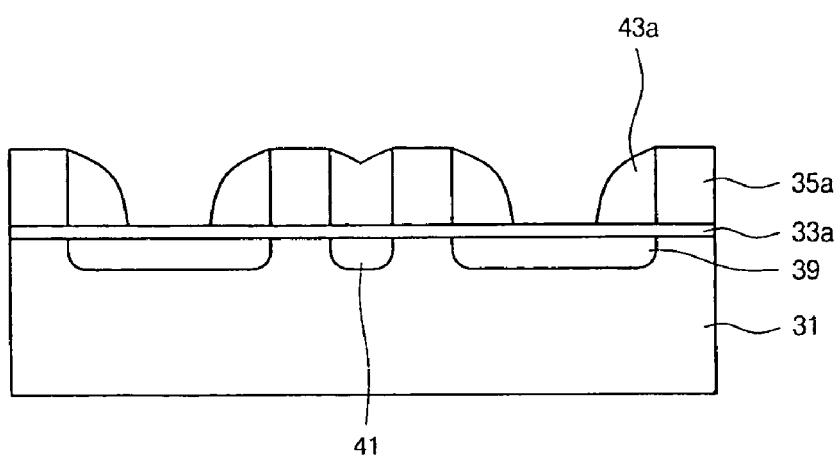

Referring to FIG. 6e, some part of the insulating layer 43 is removed to form spacers 43a on sidewalls of the pad nitride layer pattern 35a.

Figure 6F:
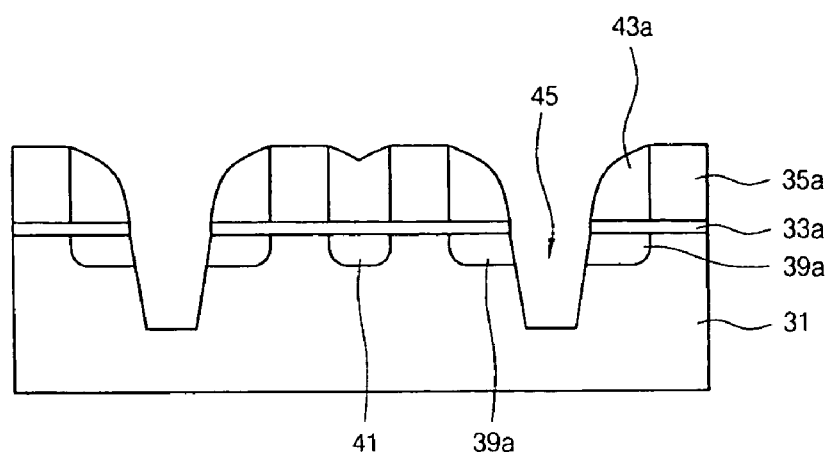

Referring to FIG. 6f, the exposed pad oxide layer 33 and the top portion of the silicon substrate 31 between the both spacers 43a are removed to form a trench 45 for device isolation. At the same time, the ion implant region 39 is divided into two parts and the implant region 39a under the spacers 43a remains as it is. The trench 45 and the ion implant region 39a are formed in a self-aligned manner.

Figure 6G:
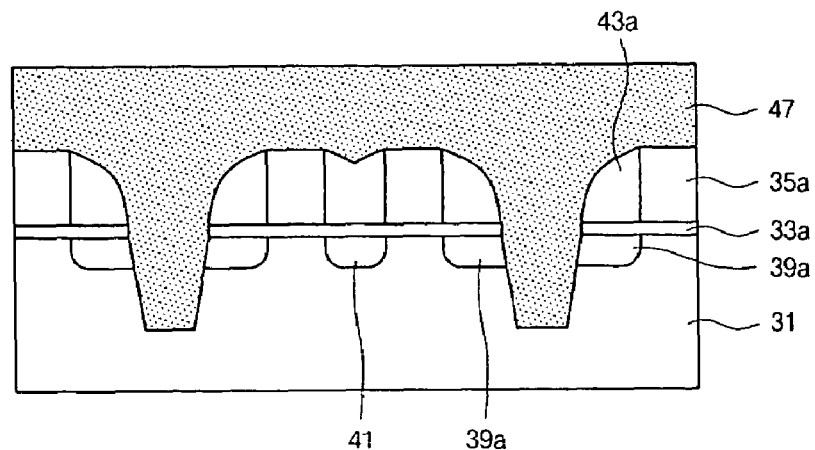

Referring to FIG. 6g, a gap filling insulating layer 47 is deposited over the resulting substrate 31. Next, a thermal treatment for the densification of the gap filling insulating layer 47 and the activation of the ion implant region may also be performed.

Figure 6H:
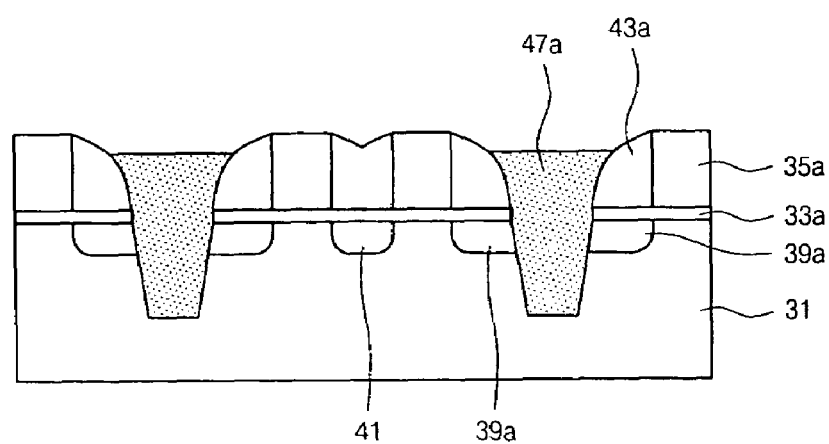

Referring to FIG. 6h, a chemical mechanical polishing (CMP) or an etch back process is performed for the gap filling insulating layer 47 to separate cells.

Figure 6I:
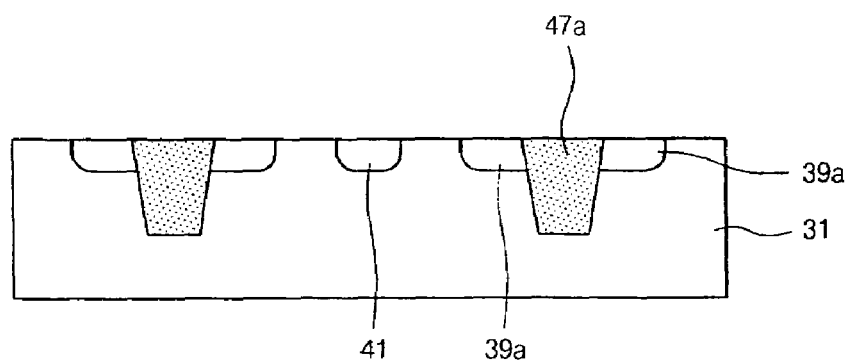

Referring to FIG. 6i, the spacers, the pad nitride layer pattern, the pad oxide layer, and the top portion of the gap filling insulating layer are removed. As a result, junction regions 39a and 41 and a trench isolation layer 47a are formed in the substrate 31.

The example memory structures described herein can embody high-integration by forming self-aligned device isolation layers and junction regions simultaneously while fabricating an AND-type flash memory cell. In addition, the example fabrication methods described herein can reduce manufacturing costs by omitting one of two mask processes using DUV.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for fabricating a flash memory cell comprising:
   forming a pad oxide layer and a pad nitride layer on a semiconductor substrate;
   patterning the pad nitride layer;
   implanting ions into the substrate to form an ion implant region;
   forming spacers on sidewalls of the patterned pad nitride layer;
   removing some parts of the pad oxide layer and the top portion of the substrate through an etching process using the spacers as a mask to form a trench that divides the ion implant region into two parts;
   forming a gap filling insulating layer over the resulting substrate; and
   forming a trench isolation layer and junction regions simultaneously by removing the spacers, the pad nitride layer pattern, the pad oxide layer, and the top portion of the gap filling insulating layer.

2. The method as defined by claim 1, wherein the spacers are formed of a material selected from the group consisting of nitride and TEOS (tetraethyl orthosilicate) oxides.

3. The method as defined by claim 1, wherein the pad oxide layer functions as a screen oxide layer during the ion implantation.

4. The method as defined by claim 1, wherein the ion implanted is one of As and P.

5. The method as defined by claim 1, wherein the spacers have a thickness between about 500 Å and 1500 Å.

6. The method as defined by claim 1, further comprising performing a thermal treatment process for the densification of the gap filling insulating layer and the activation of the ion implant region.

* * * * *

UNITED STATES PATENT AND TRADEMARK OFFICE
CERTIFICATE OF CORRECTION

| | | |
|---|---|---|
| PATENT NO. | : 7,008,856 B2 | Page 1 of 1 |
| APPLICATION NO. | : 10/750250 | |
| DATED | : December 31, 2003 | |
| INVENTOR(S) | : Chang Hun Han and Bong Kil Kim | |

It is certified that error appears in the above-identified patent and that said Letters Patent is hereby corrected as shown below:

Column 1,
Line 34, "pattern 15" should read --pattern 17--.

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,008,856 B2 | Page 1 of 1 |
| APPLICATION NO. | : 10/750250 | |
| DATED | : March 7, 2006 | |
| INVENTOR(S) | : Chang Hun Han and Bong Kil Kim | |

It is certified that error appears in the above-identified patent and that said Letters Patent is hereby corrected as shown below:

Column 1,
Line 34, "pattern 15" should read --pattern 17--.

This certificate supersedes Certificate of Correction issued August 22, 2006.

Signed and Sealed this

Tenth Day of October, 2006

JON W. DUDAS
*Director of the United States Patent and Trademark Office*